United States Patent [19]
Funahashi et al.

[11] Patent Number: 5,754,668
[45] Date of Patent: May 19, 1998

[54] EQUALIZER AND AUDIO DEVICE USING THE SAME

[75] Inventors: Hiroyuki Funahashi; Ichiro Yokomizo, both of Kyoto, Japan

[73] Assignee: Rohm Co., Ltd., Kyoto, Japan

[21] Appl. No.: 554,492

[22] Filed: Nov. 7, 1995

[30] Foreign Application Priority Data

Nov. 8, 1994 [JP] Japan .................................. 6-298776
May 16, 1995 [JP] Japan .................................. 7-141190

[51] Int. Cl.$^6$ .................................................. H03G 5/00
[52] U.S. Cl. ........................... 381/101; 381/98; 333/28 T
[58] Field of Search ................................. 381/101–103, 381/98, 108, 96, 102; 333/28 T, 28 R

[56] References Cited

U.S. PATENT DOCUMENTS

| | | | |
|---|---|---|---|
| 3,849,601 | 11/1974 | Goncharoff | 333/28 T |
| 4,521,818 | 6/1985 | Guisinger | 333/28 T |
| 4,631,525 | 12/1986 | Serravalle, Jr. | 381/109 |
| 4,982,435 | 1/1991 | Kato et al. | 381/28 |
| 5,530,769 | 6/1996 | Saitoh | 381/103 |

OTHER PUBLICATIONS

Mitchell, F. H. et al, Introduction to Electronics Design, p. 472, 1988.

*Primary Examiner*—Curtis Kuntz
*Assistant Examiner*—Ping W Lee
*Attorney, Agent, or Firm*—Fay, Sharpe, Beall, Fagan, Minnich & McKee

[57] ABSTRACT

An equalizer includes first and second differential amplifiers which have a common output and respective separate current sources, a first negative feed back circuit which feeds back a voltage signal extracted from the common output to the first differential amplifier, a second negative feed back circuit which feeds back the voltage signal to the second differential amplifier, and a filter circuit which is provided at either the first or the second negative feed back circuit and which differentiates frequency characteristics during signal amplification in the first and second differential amplifiers. A frequency characteristic is selected through selection of one of the current values of the respective current sources in response to a sound quality adjusting signal.

6 Claims, 6 Drawing Sheets

5,754,668

EQUALIZER AND AUDIO DEVICE USING THE SAME

BACKGROUND OF THE INVENTION

1. Field of the Invention

The present invention relates to an equalizer and an audio device using the same, and more specifically, relates to an equalizer in a portable type audio device such as for a portable type magnetic tape reproducing device which is composed of a circuit constituted by a limited number of elements, is capable of sound quality control and is suitable for forming into an integrated circuit.

2. Background Art

FIG. 6 is an equalizer in a conventional audio device. The equalizer is generally constituted by simulating equivalently of resistors and capacitors through a gyrator circuit provided with a multiplicity of variable Gm amplifiers, in the present example, three variable Gm amplifiers Gm1, Gm2 and Gm3 as illustrated. In the drawing, a control circuit which controls the current for the variable Gm amplifiers is omitted.

Since a multiplicity of transistors are used for constituting one variable Gm amplifier, when forming such type of an equalizer into an integrated circuit, an increase of the circuit scale can not be avoidable.

When such type of an equalizer is used in a portable type audio device, it is difficult to form the equalizer into an integrated circuit together with other circuits and further noises are likely generated because of an increase of circuit passages. An increase in number of integrated circuits causes an obstacle with respect the cost thereof as well as an obstacle with respect to the downsizing and thickness thinning thereof.

For this reason, an equalizer constituted by a combined circuit of a filter circuit including a capacitor and an amplifier circuit is generally used for the portable type audio device, and moreover in such equalizer is employed a constitution in which frequency characteristics can be selectively changed-over by a switch.

FIG. 7 is an example of a stereo audio device of such type driven by a battery in which an audio amplifier 20 is primarily illustrated. An output circuit 10 is constituted by an output amplifier 11 for left channel (L side) composed of an operational amplifier and an output amplifier 12 for right channel (R side) composed of an operational amplifier which are for reproducing sounds at right and left sides and a voltage follower type center amplifier 13 which generates a reference voltage of about Vcc/2 and produces a virtual grounding condition. The amplifier characteristics of these amplifiers normally show a substantially flat frequency characteristic in an audio band.

The output amplifier 11 at the L side receives output signals from a low frequency region mixing amplifier 15 composed of a differential amplifier via a variable resistor 14. Likely, the output amplifier 12 at the R side receives signals from a low frequency region mixing amplifier 17 composed of a differential amplifier via a variable resistor 16.

The respective low frequency region mixing amplifiers 15 and 17 receive from respective preamplifiers 18 and 19 at L and R sides reproduced audio signals at respective (+) input terminals and at the same time receive outputs from a bass boosting amplifier 21 at respective (−) input terminals via respective buffer amplifiers 15a and 17a.

The bass boosting amplifier 21 receives a sum of L+R signals of both channels at L and R sides from the pream- plifiers 18 and 19 via a low pass filter 22 composed of a resistor and a capacitor (RC) and amplifiers and outputs the low frequency region components of the L+R signals. Therefore, the amplification rate at the low frequency region of the low frequency region mixing amplifiers 15 and 17 increases depending on the output of the bass boosting amplifier 21.

Symbols Ca, Cb, Cc and Cd are respectively coupling capacitors and numerals 23 and 24 are right and left side head phones connected to the respective amplifiers in the output stage 10. A dry battery used as a power source is omitted from the drawing.

In comparison with an audio device such as a component stereo which generally has an ample margin or a slight limitation with regard to its circuit size and power source voltage, in a portable type audio device driven by a lower voltage the sound quality is sacrificed which has been allowed until now. However, in these days a high sound quality tends to be required as well as an inclination of multi functions for such portable type audio device. The requirement of a high sound quality with the low voltage drive is difficult to realized in comparison with the general audio device.

When investigating the above explained circuit from such aspect, since the bass boosting amplifier receives the L+R signals and increases the amplification rate at a low frequency region, the separation between right and left channels during bass boosting operation is deteriorated. In addition, since the low frequency region components are amplified by a special amplifier, noises thereby are increased.

SUMMARY OF THE INVENTION

An object of the present invention is to resolve the problems in the conventional art as explained above and to provide an equalizer which is constituted by a circuit having a limited number of elements and permits a sound quality adjustment.

Another object of the present invention is to provide an audio device having an audio amplifier in which the equalizer is formed into an integrated circuit together with other circuits.

Still another object of the present invention is to provide an audio device suitable for using as portable type device and having an equalizer which permits to selectively change-over the frequency characteristics by a switch.

Features of an equalizer according to the present invention which achieves the above objects are to comprise first and second differential amplifiers which have a common output and respective separate current sources; a first negative feed back circuit which negative feeds back a voltage signal extracted from the common output to the first differential amplifier; a second negative feed back circuit which negative feeds back the voltage signal to the second differential amplifier; and a filter circuit which is provided at either the first or the second negative feed back circuit and which differentiates frequency characteristics during signal amplification in the first and second differential amplifiers, and are to select a frequency characteristic through selection of one of the current values of the respective current sources in response to a sound quality adjusting signal.

Namely, outputs of the two differential amplifiers are made common, at least one of the amplifiers is provided with a different frequency characteristic from that of the other amplifier and the output is negative fed back to the respective amplifiers. Further, the current value of one current source is selected for the other and through the selection a negative feed back amount for one is varied with respect to a negative feed back amount for the other. Thereby, a frequency characteristic during the signal amplification representing an integration of the two negative feed back amounts can be selected.

As a result, an equalizer circuit is realized with an element structure fundamentally constituted by two differential amplifiers and a feed back circuit having a filter, and the number of elements used therein is reduced in comparison with the conventional circuits. Moreover, through the selection of an operating current of the respective current sources a frequency characteristic for entire amplifiers can be selected, an equalizer suitable for forming into an integrated circuit is realized. In particular, for a portable type audio device, such measures contribute for the down sizing and thickness thinning thereof as well as the circuit therefor is simplified and the sound quality thereof is improved.

DESCRIPTION OF THE PREFERRED EMBODIMENTS

Figure 1:
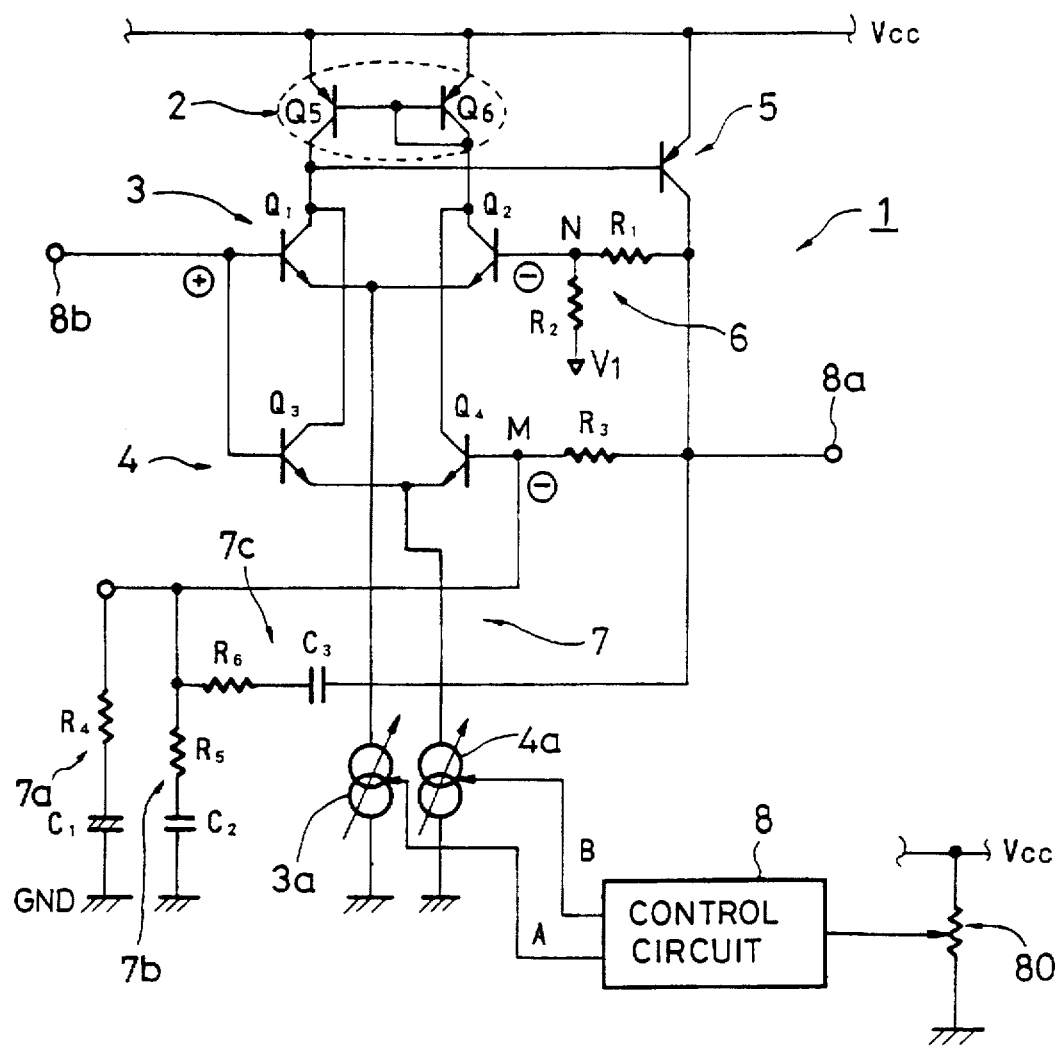
FIG. 1 is a circuit diagram of one embodiment in which an equalizer according to the present invention is applied.

In FIG. 1, an equalizer 1 is constituted by first and second amplifiers 3 and 4 which have an active load of a current mirror circuit 2 in common, an amplifier 5 which extracts an output from the common load and negative feed back circuits 6 and 7 having different negative feed back rates which negative feed back the output of the amplifier 5 to the respective differential amplifiers 3 and 4. The bases of transistors Q1 and Q3 in the first and second differential amplifiers 3 and 4 are connected in common to an input terminal 8b and the output of the amplifier 5 is connected to an output terminal 8a. The frequency characteristic of the equalizer 1 is adjusted by a control circuit 8, which generates control signals in response to a voltage of the variable resistor 80 by sound quality manipulation from an external member.

The first differential amplifier 3 is constituted by transistors Q1 and Q2 and a current source 3a therefor and includes at the respective collector sides thereof transistors Q5 and Q6 in the current mirror circuit 2 as a load. The second differential amplifier 4 is constituted by transistors Q3 and Q4 and a current source 4a therefor and likely includes at the respective collector sides thereof transistors Q5 and Q6 in the current mirror circuit 2 as a load.

The negative feed back circuit 6 is a circuit for dividing the voltage at the output terminal 8a and is constituted by a series connection of resistors R1 and R2 connected between the output terminal 8a and a bias line V1. The voltage at a voltage divided point N is fed back to the base of the transistor Q2. The negative feed back circuit 7 is constituted by a series circuit composed of a resistor R3 and a CR filter 7a connected between the output terminal 8a and ground GND, a CR filter 7b connected in parallel with the CR filter 7a and a CR filter 7c connected in parallel with the resistor R3, and the voltage at a voltage dividing point M determined by the resistor R3 and the CR filter 7a is fed back to the base of the transistor Q4. Further, the resistances of the respective resistors and capacitances of the respective capacitors are so selected that the negative feed back rate of the negative feed back circuit 7 is lower than the negative feed back rate of the negative feed back circuit 6.

The CR filter 7a and the CR filter 7c are filters for setting a low frequency range gain, the CR filter 7a is constituted by a series connection of a resistor R4 and an electrolytic capacitor C1 and the CR filter 7c is constituted by a series circuit of a resistor R6 and a capacitor C3. Further, the CR filter 7b is a filter for setting a high frequency range gain and is constituted by a resistor R5 and a capacitor C2.

The current values of the current source 3a and 4a are respectively controlled in response to current values in DC current signals A and B from the control circuit 8 and the increase and decrease of the current values in the DC current signals A and B are controlled in opposite directions each other with respect to a sound quality adjusting voltage signal of a variable resistor 80. Namely, when the voltage of the adjusting voltage signal is high, the current signal A reduces and the current signal B increases. Contrary, when the voltage of the adjusting voltage signal is low, the current signal A increases and the current signal B reduces.

The control circuit 8 which generates such current signals A and B can be realized, for example, by simply providing an inverting amplifier for a signaling line at the side of the current signal A which performs the opposite operation with regard to the adjusting voltage signal by the variable resistor 80. Then, the respective voltage signals are converted into the corresponding current values via a voltage/current converting circuit. Thus, the above explained current signals A and B are obtained.

In the equalizer 1 having amplifiers using the common load as explained, when the voltages are negative fed back to the respective differential amplifier 3 and 4 from the common output terminal 8a, the negative feed back amount to the first differential amplifier 3 is determined by the ratio of the resistance values of the resistors R1 and R2 with respect to the output voltage. Accordingly, the amplification rate determined by the differential amplifier 3 and the amplifier 5 is expressed as;

$$\text{Gain} = A/(1-A\beta) = (R1/R2)+1$$

wherein, A is the open loop gain thereof and $\beta = R1/(R1+R2)$.

Further, the negative feed back amount of the second differential amplifier 4 is determined by the radio of an impedance Z1 corresponding to the frequency characteristic of the parallel circuit of the resistor R3 and the CR filter 7c to an impedance Z2 corresponding to the frequency characteristic of the parallel circuit of the CR filters 7a and 7b with respect to the output voltage and the amplification rate determined by the differential amplifier 4 and the amplifier 5 is expressed as;

$$\text{GainG} = A/(1-A\beta) = \{R3\|(R6+1/\omega C3)\}/R4+1$$

wherein A is the open loop gain thereof, $\beta = Z1/(Z1+Z2)$ and $R3\omega(R6+1/\omega C3)$ is a parallel resistance value of the resistor R3 and a series circuit of the resistor R6 and the capacitor C3.

Figure 2:
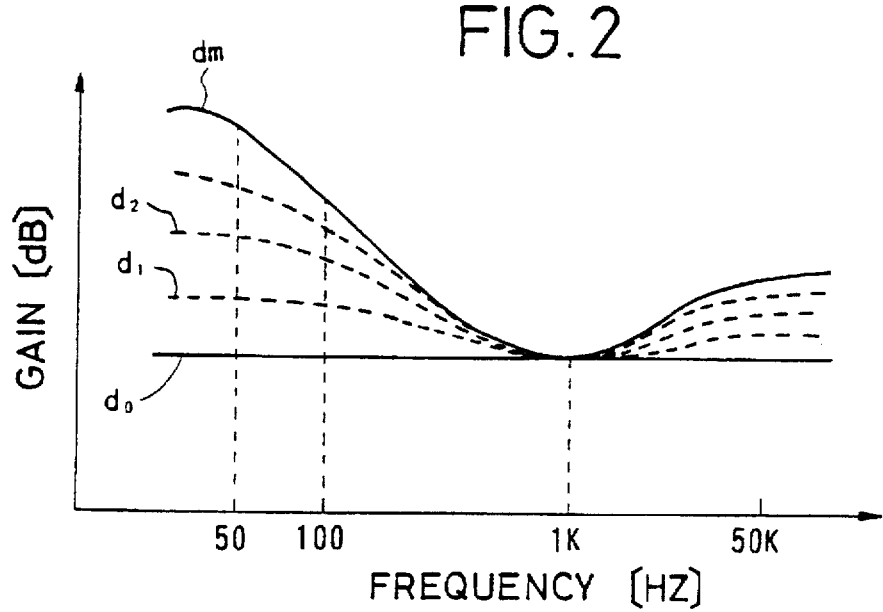
FIG. 2 is a view for explaining an adjustable frequency characteristic of the equalizer.

Now, at first the amplification characteristic of a combined amplifier consisting of the differential amplifier 3 and the amplifier 5 with respect to the input signals is discussed. Since the negative feed back circuit 6 is constituted by the resistors R1 and R2, the frequency characteristic thereof shows a flat frequency characteristic determined by the equation of Gain G≈(R1/R2)+1. As a result, the characteristic do as shown in FIG. 2 is obtained through this combined amplifier.

Secondly, the amplification characteristic of another combined amplifier consisting of the differential amplifier 4 and the amplifier 5 with respect to the input signals is discussed. Since the negative feed back circuit 7 has a frequency characteristic, the negative feed back circuit 7 shows the lowest negative feed back rate determined by the resistors R3 and R4 in a frequency band in which the resistance value of the electrolytic capacitor C1 can be neglected among the low frequency region components in the input signals, and the gain G of the combined amplifier is represented as;

Maximum gain G≈(R3/R4)+1. When frequencies of the input signals exceed the above frequency band the resistance value of the electrolytic capacitor C1 increases to an innegligible value and the negative feed back voltage increases depending on the resistance value of the resistor R4 and the electrolytic capacitor C1. As a result, the gain G of this combined amplifier decreases. When the frequencies of the input signals reaches to an intermediate region of comparatively high frequencies, the resistance value of the electrolytic capacitor C1 increases, further the resistance value of the series circuit of the resistor R6 in the CR filter 7c and the capacitor C3 decreases, thus the negative feed back voltage increases. Accordingly, the gain of the combined amplifier is represented as;

Gain $G≈(R6/R4)+1$ wherein R6<R3. On the other hand, with respect to frequencies in high frequency region components among the input signals the resistance value of the series circuit of the resistor R5 and the capacitor C2 is added in parallel to the resistance value of the resistor R4. Thereby the negative feed back voltage is limited to some extent, and the gain in the high frequency region is suppressed low. Accordingly, the gain of the combined amplifier at this instance is expressed as;

Gain $G≈(R6/R4\omega R5)+1$.

As a result of the above discussion, when the current value of the current source 4a is set near its maximum current value, the characteristic dm as shown in FIG. 2 is obtained through the amplifier.

In the present embodiment, the amplifier 5 constitutes a common amplifier which receives output voltage signals via the common load in the form of the current mirror for the differential amplifiers 3 and 4. Accordingly, the output of the amplifier 5 shows a voltage representing substantially the logical sum of the respective outputs of the differential amplifiers 3 and 4. Therefore, when the operating currents of the respective differential amplifiers 3 and 4 are equal, a priority is given to the operation of an amplifier in a circuit showing a larger negative feed back amount among the negative feed back circuits connected to the output.

This is because that when obtaining a voltage output via a common load composed of a wired OR, an amplifier receiving a larger negative feed back amount with respect to the same output voltage is subjected to a larger amplification rate effect, thereby the entire output reduces and a negative feed back circuit having a larger negative feed back amount is largely affected with respect to the reduced output voltage in comparison with the negative feed back amount to the other amplifier to perform again a negative feed back. Accordingly, the characteristic of an amplifier disposed in the negative feed back circuit having a larger negative feed back amount appears with priority in the entire amplifier characteristic by the rate of the negative feed back amount at the side of the instant amplifier to the negative feed back amount to the other amplifier. Therefore, through controlling the respective negative feed back amounts in response to the operating currents of the two amplifiers the frequency characteristics of the respective amplifiers are combined with a predetermined rate and the combined frequency characteristic can be used as that of the equalizer 1.

In the present embodiment, because of the difference in frequency characteristics of the negative feed back circuits 6 and 7 the frequency characteristics of the differential amplifiers 3 and 4 are differentiated. The differential amplifier 3 is provided with a flat frequency characteristic and the differential amplifier 4 is provided with a frequency characteristic having a high gain at low and high frequency regions. As a result, a synthesized characteristic of the characteristics of the differential amplifiers 3 and 4 determined depending on the respective negative feed back amounts is obtained as the frequency characteristic of the entire amplifiers.

Since the negative feed back rate of the negative feed back circuit 7 is set lower in advance than the negative feed back rate of the negative feed back circuit 6, the flat frequency characteristic of the differential amplifier 3 receiving a larger negative feed back amount is given priority, in particular, with respect the characteristic in the medium frequency region. Thereby, a range of the flat frequency characteristic is enlarged in the intermediate frequency range wherein a sound quality emphasis is seldom required. The respective actual negative feed back amounts are determined by the operating currents of the respective differential amplifiers 3 and 4. The operating currents of the respective differential amplifiers can be determined by the current values of the current sources 3a and 4a. These current values are controlled by the control current values in the DC current signals A and B from the control circuit 8.

Because of the above reason, when the operating currents of these current sources 3a and 4a are set equal, the frequency characteristic of the differential amplifier 3 is given priority and the signal amplification characteristic of the equalizer 1 is gradually narrowed depending on the increase of frequency emphasis in the flat frequency characteristic in the intermediate frequency region as illustrated in FIG. 2. Further, when only the current source 3a is operated and the current of the current source 4a is interrupted, a completely flat frequency characteristic do as illustrated in FIG. 2 is realized. Contrary, when the current of the current source 4a becomes larger than that of the current source 3a and the negative feed back amount at the side of the differential amplifier 4 becomes larger than that at the side of the differential amplifier 3, the frequency characteristic at the side of the differential amplifier 4 is given priority. At such instance the frequency characteristic determined by the respective CR filters 7a, 7b and 7c is provided. In this instance a frequency characteristic which continuously varies in a range of d1, d2, . . . , dm as shown in FIG. 2 depending on the operating current set by the current source 4a is obtained.

Therefore, when the variable resistor 80 is out of intensifying operation condition of low and high tone, for example, the movable contact of the variable resistor 80 locates at the lower most position, the control circuit 8 generates a control current signal A which maximizes the current value of the current source 3a and the operating current of the current source 4a is rendered zero. At this instance, the amplifier in the equalizer 1 operates as an amplifier having a flat frequency characteristic with gaih G≈(R1/R2)+1. When the movable contact of the variable resistor 80 is moved upward to provide a low and high tone intensifying operation condition, the control circuit 8 generates the current signals A and B which respectively reduce the operating current of the current source 3a and increase the operating current of the current source 4a depending on the operation amount of the movable contact. At this instance, a frequency characteristic such as d1 and d2 is, for example, selected among the frequency characteristics from do to dm. Further, the movable contact of the variable resistor 80 reaches to the upper most position, the operating current of the current source 3a is rendered zero and the operating current of the current source 4a is maximized. At this instance, the gains at the lower frequency region, at the intermediate frequency region and at the high frequency region are respectively given as gain G≈(R3/R4)+1, gain G≈(R6/R4)+1 and gain G≈(R6/R4ωR5)+1. As a result, the amplification characteristic of the equalizer 1 at this instance assumes the frequency characteristic dm.

Figure 3:
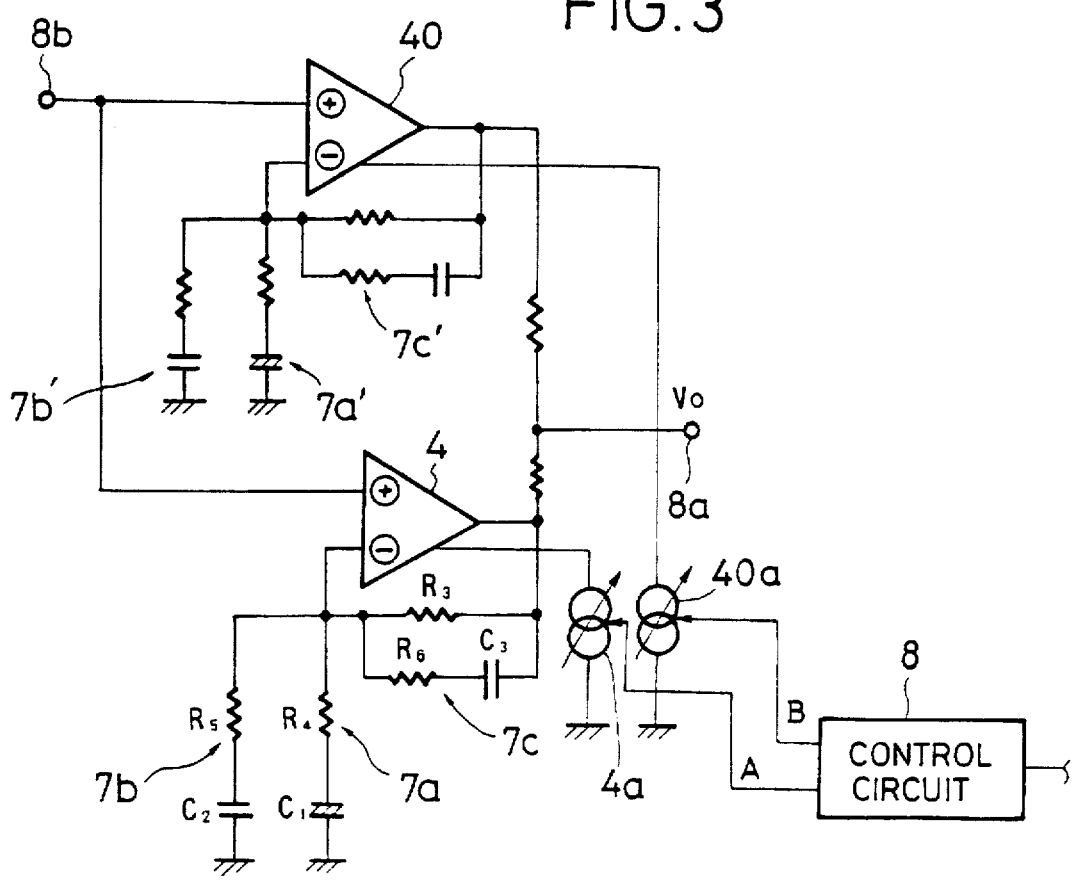
FIG. 3 is a circuit diagram of another embodiment according to the present invention.

In FIG. 3 embodiment, the differential amplifier 3 in FIG. 1 embodiment is eliminated, instead, a differential amplifier 40 having the same structure as of the differential amplifier 4 is provided independently, and the output sides of these differential amplifiers are connected in common to the output terminal 8a and the voltage of the output terminal 8a is fed back to the respective differential amplifiers. A current source 40a corresponds to the current source 4a and is a current source for the differential amplifier 40.

The control of the current values of the respective current sources 4a and 40a is performed by the control circuit 8. The frequency characteristics of the respective CR filters 7a', 7b' and 7c' for the differential amplifier 40 are different from those of the respective CR filters 7a, 7b and 7c.

As a result, when the operating currents of these current sources are set substantially the same, the combined amplifiers show a combined frequency characteristic, and further when the operating current of the differential amplifier 4 is increased and the operating current of the differential amplifier 40 is decreased, the gain of a predetermined frequency band of the differential amplifier 4 can be intensified and when the operating current of the differential amplifier 4 is decreased and the operating current of the differential amplifier 40 is increased, the gain of a predetermined frequency band of the differential amplifier 40 can be intensified.

Figure 4:
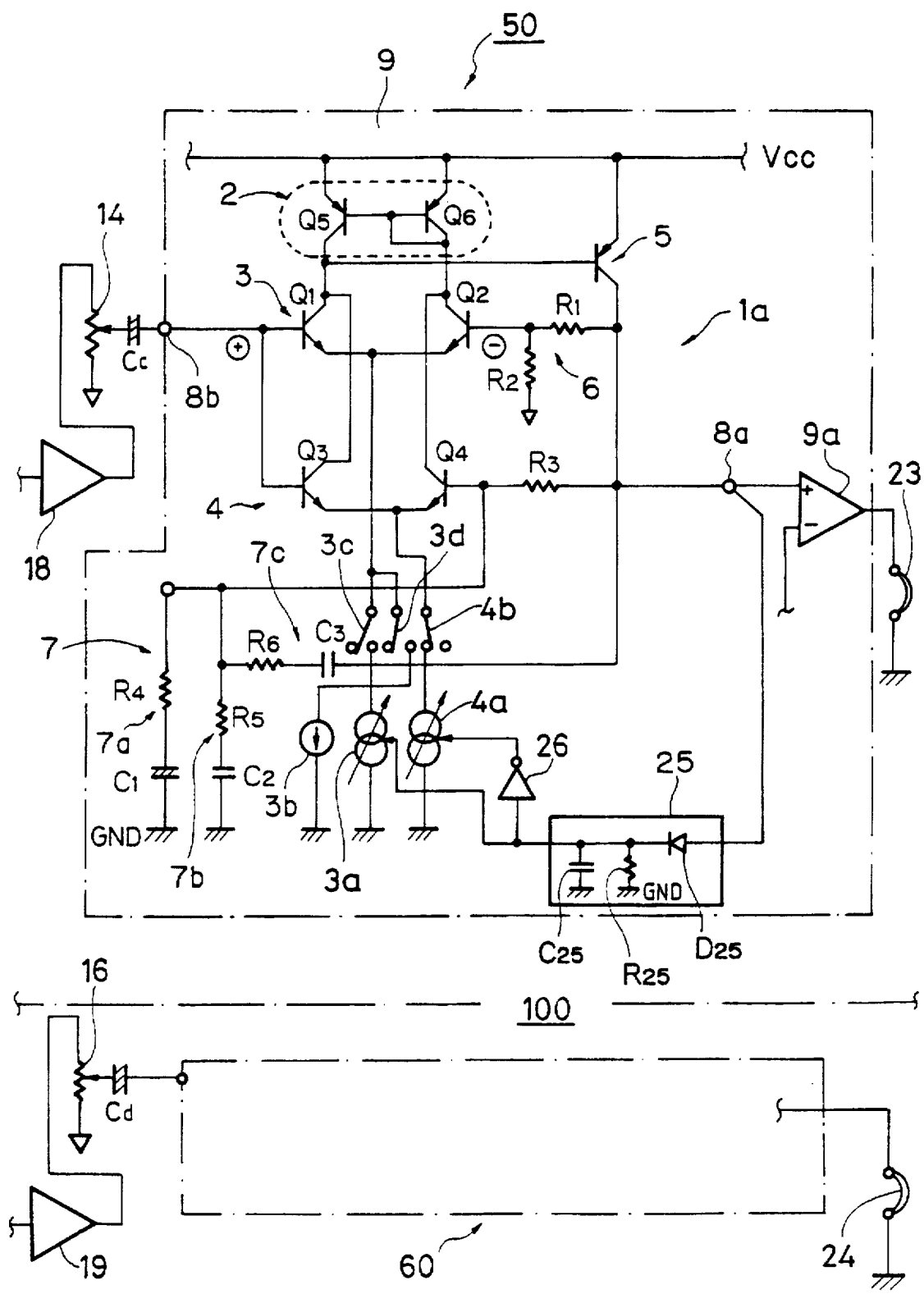
FIG. 4 is a circuit diagram of an embodiment when an equalizer according to the present invention is applied to a portable type audio device in which circuit an audio amplifying circuit portion is primarily illustrated.

FIG. 4 shows an example of portable type audio devices in which numeral 100 is the portable type audio device, 50 is an audio amplifying circuit at L side and 60 is an audio amplifying circuit at R side. Since these two audio amplifying circuits 50 and 60 have a same circuit structure, only the audio amplifying circuit 50 at L side is shown in detail. Further, the same constitutional elements as in FIG. 7 are assigned the same reference numerals and the explanation thereof is omitted.

Figure 7:
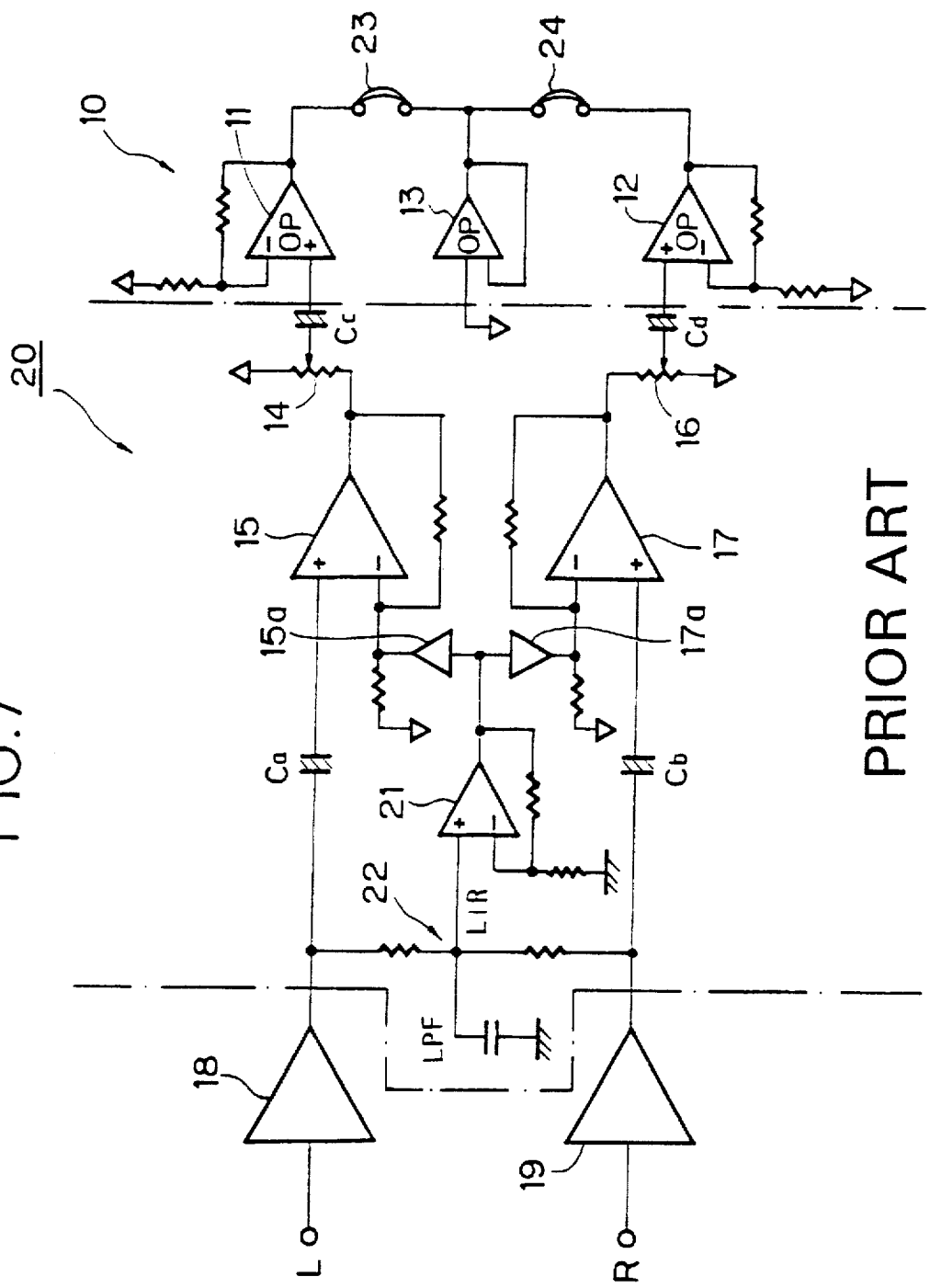
FIG. 7 is an example of variable Gm amplifier circuits in the equalizer shown in FIG. 6.

Numeral 9 is an output amplifying circuit of the audio amplifying circuit 50 and corresponds to the output amplifier 11 at the L side in FIG. 7, and in the present embodiment no center amplifier 13 in FIG. 7 is used which is an independent circuit from both the output amplifiers at the L and R sides. However, the center amplifier 13 can be added so as to take the same constitution as in FIG. 7. In such instance, the output amplifier 11 is replaced by the output amplifying circuit 9 and likely the output amplifier 12 is replaced by the output amplifying circuit 9.

An equalizer 1a in the output amplifying circuit 9 is a circuit corresponding to the equalizer 1 in FIG. 1, however, in the present embodiment the equalizer 1a constitutes an input stage in the output amplifying circuit 9. The selection of the frequency characteristic therefor, in that the sound quality adjustment, is performed by the switches 3c, 3d and 4b in place of the control by the variable resistor 80 and the control circuit 8. Further, in order to prevent saturation of the output waveform a maximum amplitude detection circuit 25 is provided at the output terminal 8a of the equalizer 1a through which the output of the equalizer 1a is limited so as not to exceed a predetermined value. Further, since the frequency characteristic is selected by the switches in the equalizer 1a, a constant current source 3b which is connectable via the switch 3c is provided separately as a current source for the differential amplifier 3 so as to select a flat frequency characteristic.

When the switch 3c is turned ON, the common emitters of the differential transistors Q1 and Q2 are connected to the current source 3a via the switch 3c and the first differential amplifier 3 is grounded, further when the switch 3d is turned ON, the common emitters are connected to the constant current source 3b via the switch 3d and the first differential amplifier 3 is grounded. When the switch 4b is turned ON, the common emitters of the differential transistors Q3 and Q4 are connected to the current source 4a via the switch 4b and the second differential amplifier 4 is grounded.

To the output terminal 8a the maximum amplitude detection circuit 25 is further connected and the detection signal of the maximum amplitude detection circuit 25 is applied to the current source 3a as well as applied to the current source 4a via an inverting amplifier 26. The maximum amplitude detection circuit 25 is constituted by a serise circuit of a diode D25 and a capacitor C25 connected between the output terminal 8a and ground GND and a resistor R25 connected in parallel with the capacitor C25. When a voltage is generated at the terminal 8a which is sufficient to render the diode D25 conductive, the diode is turned ON and a predetermined electric charge is charged into the capacitor C25 to generate the detection signal. The electric charge in the capacitor C25 is applied to the current source 3a in a form of current so as to increase the operating current, thereby the negative feed back amount is increased and the saturation of the output waveform is suppressed. Likely, the detection signal is applied to the current source 4a via the inverting amplifier 26 to reduce the operating current, thereby an decrease of the negative feed back amount at low and high frequency region is suppressed so that the saturation of the output waveform is also suppressed.

The electric charge in the capacitor C25 is discharged at a predetermined time constant τ which is determined by the resistance of the resistor R25 and the capacitance of the capacitor C25, and after a certain predetermined time the suppression is released.

The respective current values of the current sources 3a and 4a are set at predetermined values except for the instance when the detection signal is generated from the maximum amplitude detection circuit 25. When the switches 3d and 3c is turned OFF and the switch 4b is turned ON (as illustrated in the drawing), only the differential amplifier 4 is rendered operative via the current source 4a and the current value of the current source 4a is set so that the frequency characteristic of the amplification rate thereby assumes the characteristic dm among the characteristics shown in FIG. 2.

When the switch 3d is turned OFF and the switches 3c and 4b are turned ON, both the differential amplifiers 3 and 4 are rendered operative via the current source 3a and the current value of the current source 3a is set so that a frequency characteristic of the amplification rate thereby is selected representing an intermediate frequency characteristic between do and dm among the frequency characteristics as shown in FIG. 2, for example, the frequency characteristics such as d1 and d2 is selected. Further, as explained previously when the switches 3c and 4b are turned OFF and the switch 3d is turned ON, the constant current source 3b is activated and the current of the constant current source 3b is set so that the frequency characteristic do is selected among the frequency characteristics as shown in FIG. 2.

Therefore, when a frequency characteristic dm as shown in FIG. 2 in which low and high tone regions are intensified is required, only the switch 4b is turned ON and the other switches are turned OFF, and when a frequency characteristic in which low and high tone regions are properly boosted is required, the switches 4b and 3c are turned ON and the others are turned OFF. Further, when a flat frequency characteristic is required, the switch 3d is turned ON and the others are turned OFF.

In the above for the sake of explanation convenience a separate operation of three discrete switches is explained, however when the above switching elements are constituted by a switching circuit, the ON/OFF operations of the respective switching elements can be easily associated each other.

Further, the output of the amplifier 9a which serves as the output for the head phone 23 can be directly connected to the input of the maximum amplitude detection circuit 25.

Figure 5:
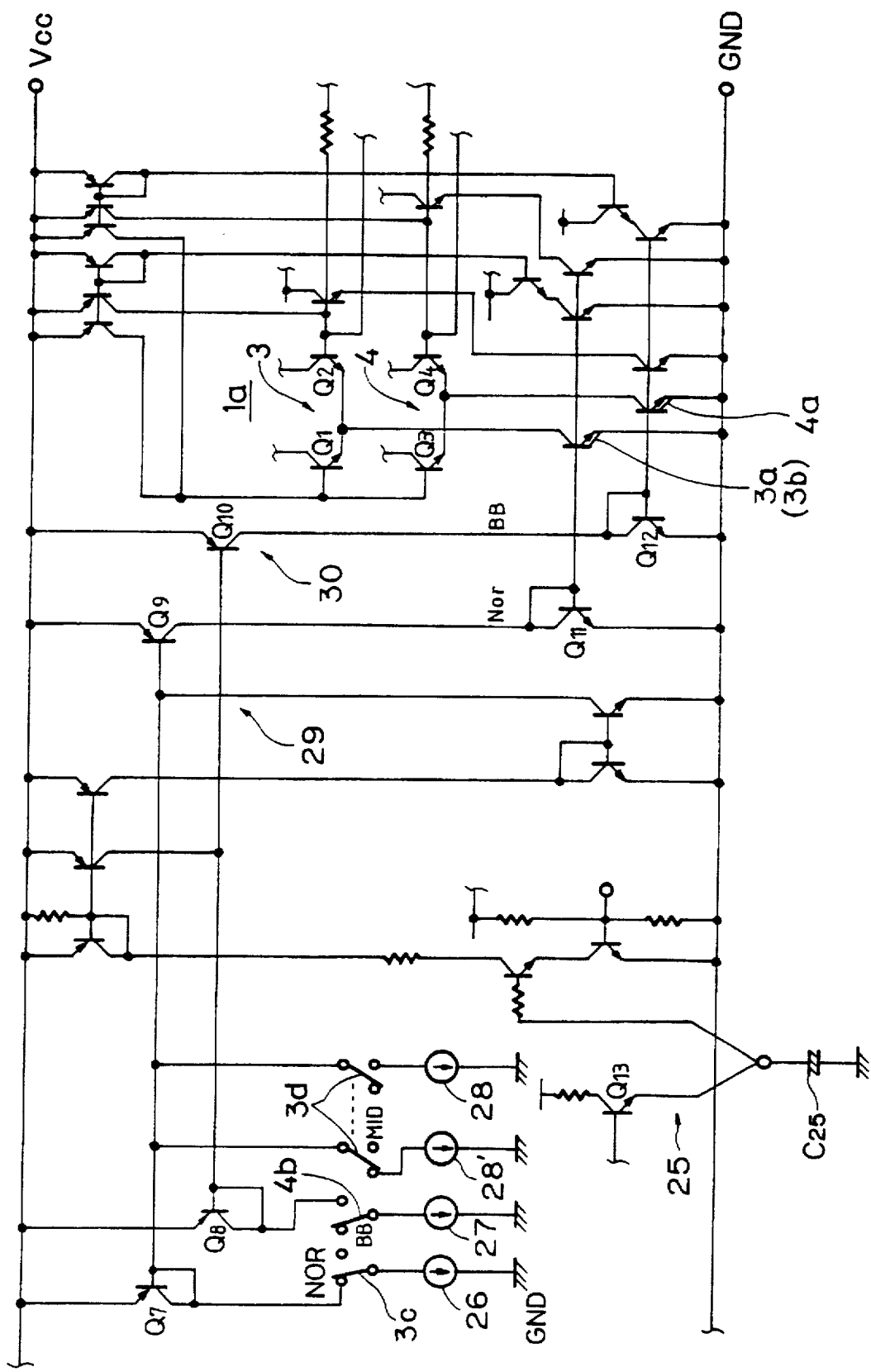
FIG. 5 is a specific circuit diagram when driving the equalizer shown in FIG. 4 with a low voltage.
Figure 6:
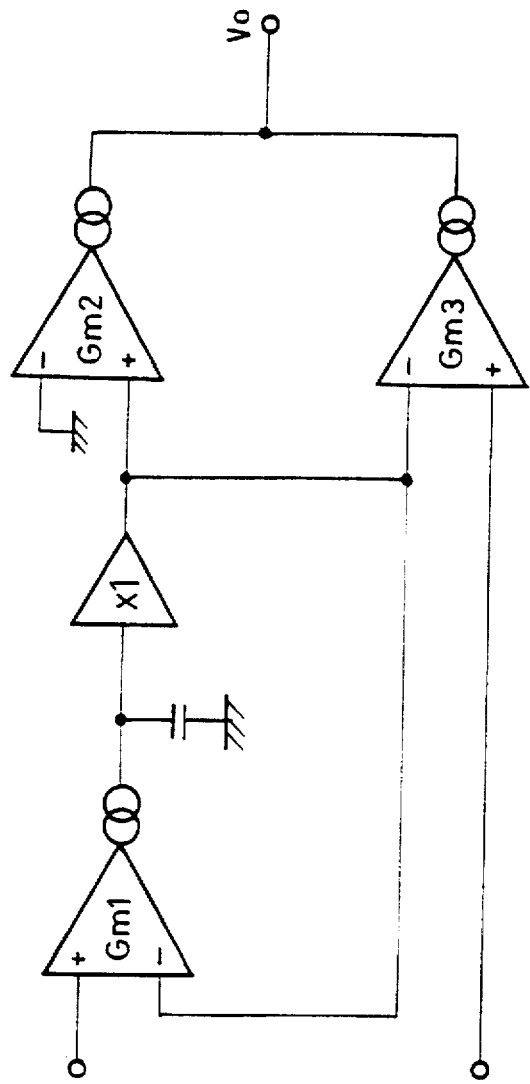
FIG. 6 is a block diagram of an equalizer in a conventional audio device.

FIG. 5 is a specific circuit which permits a low voltage drive by eliminating the respective switches for selecting the frequency characteristics provided at the bottom side of the differential amplifier circuit.

In the present embodiment, the current values set by ON/OFF of the respective switches are transmitted to the differential amplifiers 3 and 4 via current mirror circuits to thereby set the current values of the respective current sources.

The current values of the current sources 3a and 4a are selected by current sources 26, 27, 28 (28') and switches 3c, 4b and 3d. A series circuit of the current source 26 and the switch 3c and a series circuit of the current source 27 and the switch 4b are respectively connected between the power source line Vcc and ground GND via input side transistors Q7 and Q8 of current mirror circuits of 29 and 30. A series circuit of the current sources 28 and 28' and a double throw switch 3d is connected between the base of the transistor Q7 and ground GND. As a result, the series circuits of the respective switches and current sources are arranged in parallel with respect to the differential amplifiers 3 and 4 between the power source line Vcc and ground GND.

The current mirror circuit 29 is connected in a manner of current mirror to the base of the transistor of the current source 3a (3b) via output side transistors Q9 and Q11, and the current mirror circuit 30 is also connected in a manner of current mirror to the base of the transistor of the current source 4a via output side transistors Q10 and Q12. With this measure, the operating current values set by the selected current sources 26, 27 and 28 (28') are transmitted to the current sources 3a (3b) and 4a and these current mirror circuits 29 and 30 serve as an operating current value setting circuit for the current sources 3a (3b) and 4a.

In the drawing, NOR represents a condition normal) of a flat frequency characteristic, BB represents a condition (bass boosting) wherein low and high frequency regions are boosted, and MID represents a condition wherein the frequency characteristic at the intermediate frequency region is intensified. Further, in place of the diode D25 in the maximum amplitude detection circuit 25 in FIG. 4 embodiment a transistor Q13 is provided in the present embodiment. When the transistor Q13 is turned ON, the transmitting current through the mirror circuit 30 decreases, as a result, the current value of the current source Q4 reduces.

As will be understood from the above description the equalizer 1 shown in FIG. 1 can be disposed in the input stage of the output amplifier circuit like the equalizer 1a as shown in FIG. 4.

Further, the switches 3c, 3d and 4b as shown in FIG. 4 can be provided between the current sources 4a and 40 for the respective amplifiers in the circuit shown in FIG. 3 so as to permit the frequency characteristic selection through the switching operation.

When forming the equalizer shown in FIG. 5 into an integrated circuit, the capacitor C1 constituting the low pass filter or the series circuit of the resistor R4 and the capacitor C1 has to be connected to the integrated circuit from the outside, however capacitors which have very small capacitance, and resistors can be incorporated into the integrated circuit. Moreover a conventional boosting amplifier exclusively used for a low frequency region is dispensed with and the circuit scale is reduced.

Further, in the embodiments three switching circuits are used, however when the switching circuit 3c and the current source 3d are eliminated and the constant current source 3b is directly connected to the common emitter of the differential amplifier 3 without routing the switching circuit 3a, the flat frequency characteristic produced only by the operation of the differential amplifier 3 or the low and high frequency region intensified characteristic produced by the operation of the differential amplifiers 3 and 4 can be selected with only one switching circuit, in that the switching circuit 4a.

For the sake of explanation convenience these switching circuits in the embodiments are disposed between the current sources and the common emitter of the differential amplifiers, however, the disposition thereof can be modified so long as the function of these switching circuits is fulfilled which are required to turn ON/OFF the currents of the respective current sources or set the current values thereof at predetermined values as shown in FIG. 5.

We claim:

1. An equalizer comprising:
   first and second differential amplifiers which have a common load, a common output extracted via said common load, and respective separate current sources;
   a first negative feed back circuit which negative feeds back a voltage signal extracted from the common output to said first differential amplifier;
   a second negative feed back circuit which negative feeds back the voltage signal to said second differential amplifier, and
   a filter circuit which is provided at either said first or said second negative feed back circuit and which differentiates frequency characteristics during signal amplification in said first and second differential amplifiers, wherein a frequency characteristic through selection of one of the current values of the respective current sources is selected in response to a sound quality adjusting signal.

2. An equalizer according to claim 1, wherein the current values of the respective current sources are determined in response to the sound quality adjusting signal.

3. An equalizer according to claim 2, further comprising a controller which controls the current values of the current sources in response to the sound quality adjusting signal, and wherein through setting current values of the respective current sources by said controller a frequency characteristic between the frequency characteristics of said first and second differential amplifiers is selected.

4. An equalizer according to claim 1, further comprising a switch; wherein through the operation of said switch, the current values of one of the current sources are determined.

5. An equalizer according to claim 1, wherein the negative feed back rate of said first negative feed back circuit is determined larger than the negative feed back rate of said second negative feed back circuit.

6. An audio device comprising:

first and second differential amplifiers which have a common load, a common output extracted via said common load, and respective separate current sources;

a first negative feed back circuit which negative feeds back a voltage signal extracted from the common output to said first differential amplifier;

a second negative feed back circuit which negative feeds back the voltage signal to said second differential amplifier;

a filter circuit which is provided at either said first or the second negative feed back circuit and which differentiates frequency characteristics during signal amplification in said first and second differential amplifiers;

a controller which controls the current values of the respective current sources in response to a sound quality adjusting signal;

an adjusting means which generates the sound quality adjusting signal; and an output stage amplifier which amplifies the voltage signal upon receipt thereof, wherein through the setting of the current values of the respective current sources by said controllers, one of the frequency characteristics of said first and second differential amplifiers is selected.

* * * * *